United States Patent [19]

Bartunek et al.

[11] Patent Number: 5,504,345
[45] Date of Patent: Apr. 2, 1996

[54] DUAL BEAM SENSOR AND EDGE DETECTION SYSTEM AND METHOD

[75] Inventors: Hans Bartunek; Mark Cerny, both of Mountain View, Calif.

[73] Assignee: Hama Laboratories, Inc., Mountain View, Calif.

[21] Appl. No.: 227,736

[22] Filed: Apr. 14, 1994

[51] Int. Cl.$^6$ .................................................. H01J 40/14
[52] U.S. Cl. .................. 250/559.4; 250/559.36; 414/936
[58] Field of Search .................. 250/221, 222.1, 250/223 R, 559.33, 559.36, 559.40, 578.1; 356/375; 340/674; 414/936–938, 222, 331, 274

[56] References Cited

U.S. PATENT DOCUMENTS

| | | | |
|---|---|---|---|
| H933 | 7/1991 | Buczek et al. | 356/5 |
| 4,259,019 | 3/1981 | Johannmeier et al. | 250/559.33 |
| 4,673,805 | 6/1987 | Shepard et al. | 235/472 |
| 4,786,126 | 11/1988 | Kramer | 350/3.71 |
| 5,003,188 | 3/1991 | Igari | 414/274 |
| 5,225,691 | 7/1993 | Powers et al. | 250/559.4 |
| 5,231,463 | 7/1993 | Shambaugh | 356/336 |
| 5,418,382 | 5/1995 | Blackwood et al. | 414/936 |

*Primary Examiner*—Stephone B. Allen
*Attorney, Agent, or Firm*—Fred J. Zustak; Jacques M. Dulin

[57] ABSTRACT

A semiconductor wafer and magnetic disk edge detection system having a sensor unit comprising a dual beam light source spatially oriented so that the beams focus and converge at a single point external to the sensor unit, and dual light detectors spatially oriented to allow detection of light reflected from the edges of the wafers and disks even where the angle of incidence of the light onto the edge deviates significantly from the perpendicular. The sensor unit works in operative combination with a scanning motion means to move the sensor across the edges of the wafers or disks to be detected, typically by attachment of the sensor unit to a linear motor or a robotic arm, or alternately, by manually detecting the edges of the wafers and disks.

12 Claims, 3 Drawing Sheets

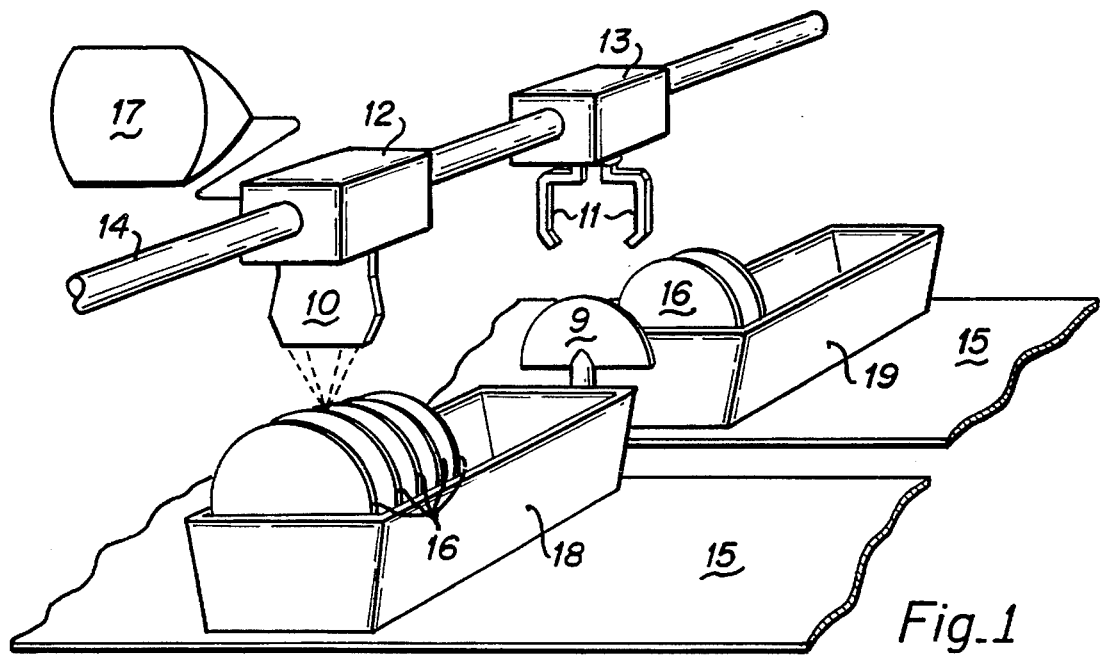
Fig._1
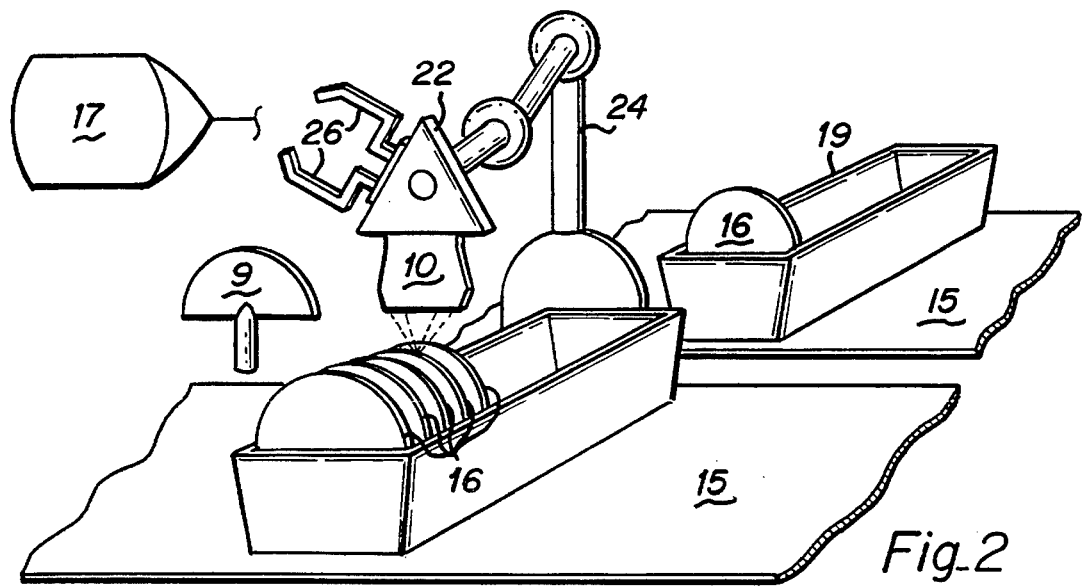
Fig._2

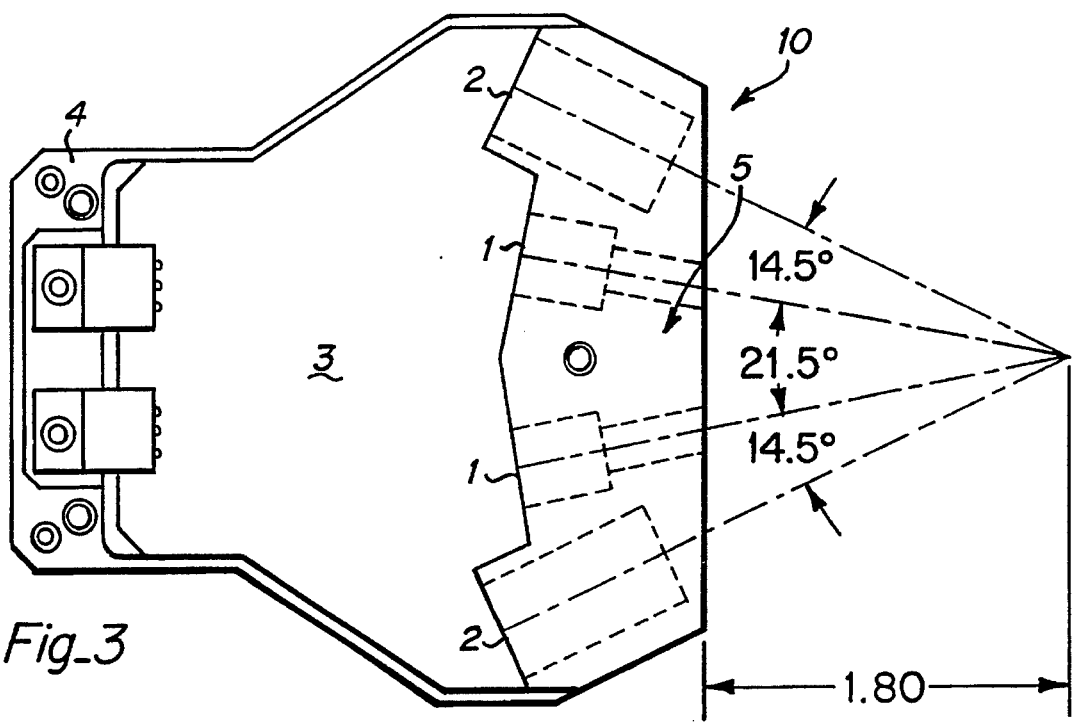
Fig_3
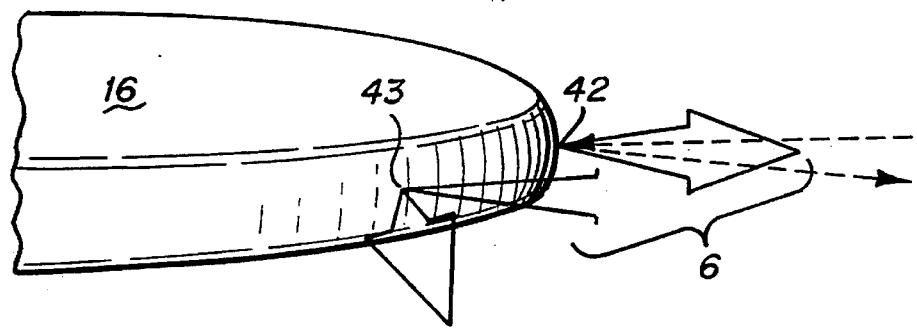
Fig_4A
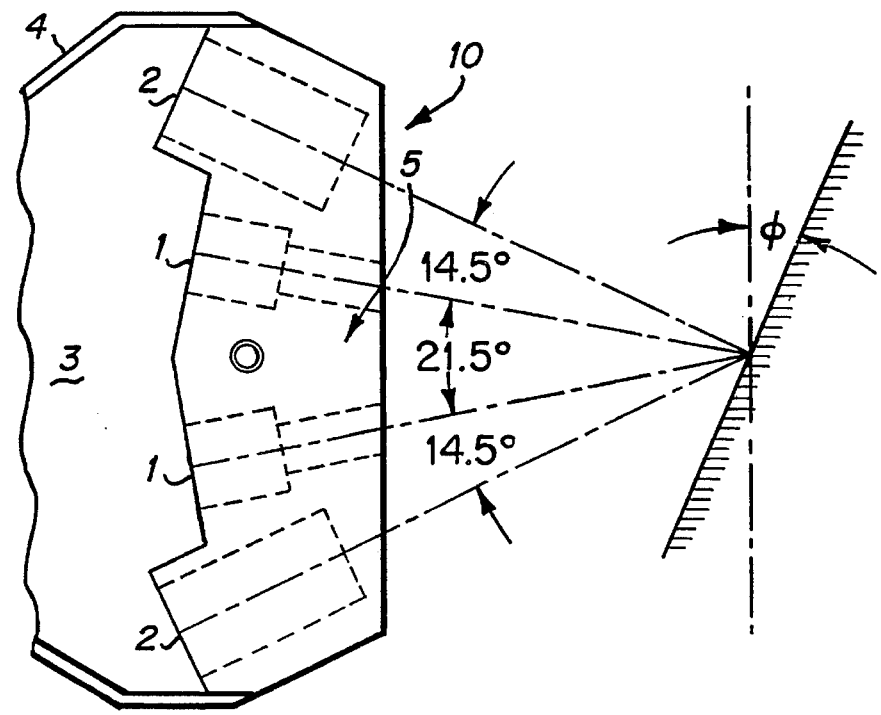
Fig_4B

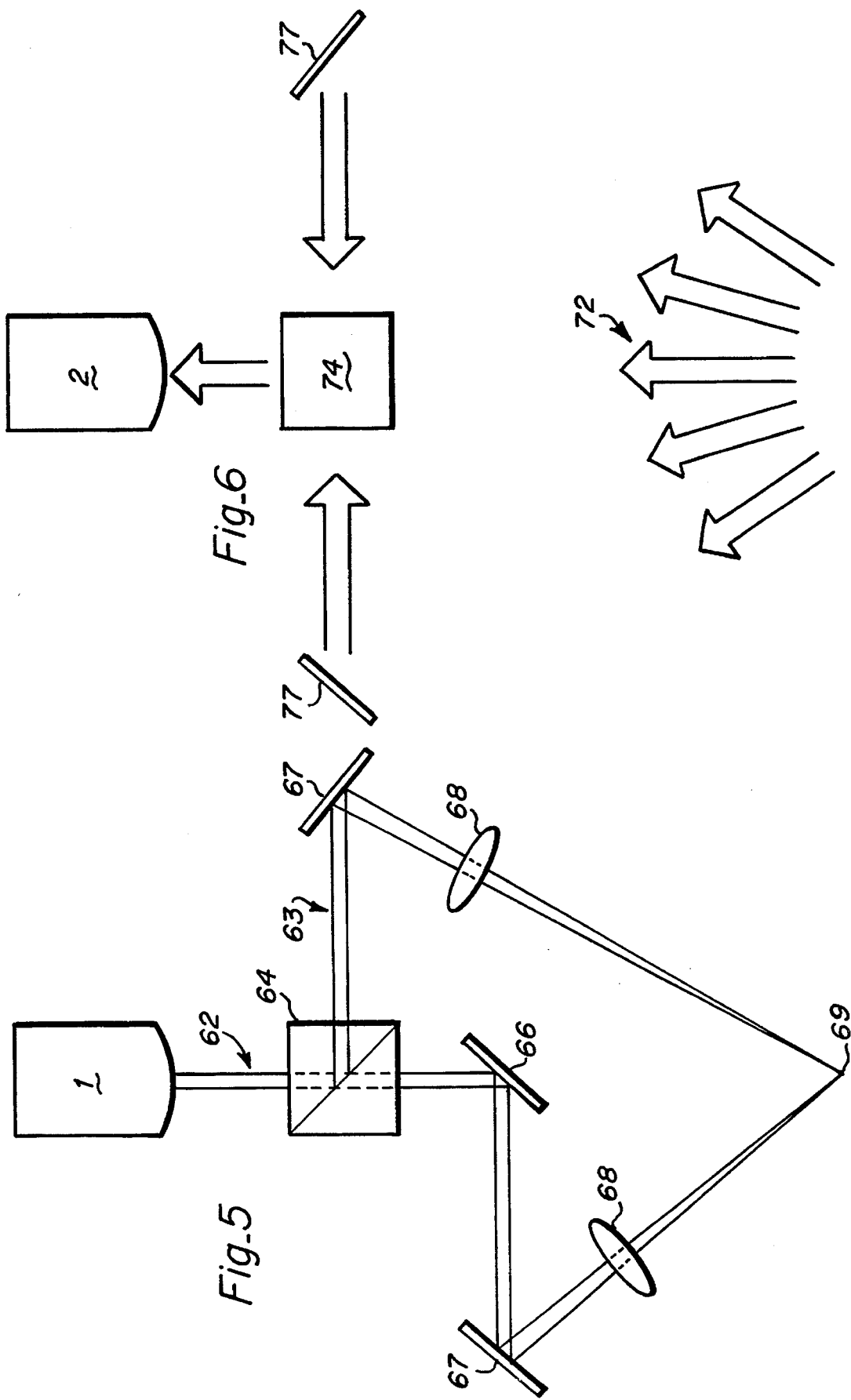

DUAL BEAM SENSOR AND EDGE DETECTION SYSTEM AND METHOD

BACKGROUND OF THE INVENTION

1. Field of the Invention

The present invention relates to a converging dual-beam optical semiconductor wafer and magnetic disk edge detection system for detecting the presence of small, specular surfaces. More particularly, the present invention relates to a detection system which includes an optical sensor having at least 2 light sources, preferably lasers, and at least 2 light detectors spatially oriented such that the beams from the light sources define a plane and converge at a single point external to the device, and the light detectors are arranged such that the specular or reflective surface to be detected interrupts the beam at or near the focal point causing the light to be reflected backwards towards the sensor for detection by the light detectors.

2. Brief Description of the Prior Art

Since the construction of the first laser in 1960, the use of lasers in science, industry, and commerce has steadily risen. The semiconductor and magnetic disk storage device industry is no exception. Lasers are being used in these industries to perform processes such as intricate etching, and cutting operations on semiconductor wafers, and to measure physical product attributes, such as the film thickness of a lubricant layer on a substrate.

A proposed use for the device of the present invention is for the detection of the perimeter edge of semiconductor wafers or magnetic memory disks particularly where such wafers or disks are spaced in close proximity to one another either for processing or transport. Semiconductor wafers and small magnetic disks are generally racked or mounted vertically on their edges and stacked horizontally in plastic cassette carriers or boats. Each carrier contains many parts next to each other with a small separation between each part. Detecting the edge of a wafer or disk permits accurate positioning information to be obtained allowing automated handling equipment to access and remove individual parts for processing without damaging adjacent parts in the carrier. Further, the device of the present invention can detect improperly aligned parts, missing parts, double-wafers or double-disks (i.e., wafers or disks mounted with no spaces between them) alerting the technician or automated equipment to possible defective parts, or to pass over the defective parts to prevent further processing.

Work-in-progress inventories of unfinished product require that an accurate count be made of the aggregate number of parts in the special cassettes or boats throughout the process line. This count is then used to valuate the unfinished goods in the process line, as well as to suggest improvements to queuing and parts flow to reduce costs associated with excess inventory. Similarly parts flow tracking to identify process bottlenecks and low yield processes is essential in production hardware planning and process improvement efforts. Counting the parts throughput at a particular operation and comparing it to the throughput required to meet market demand assists the capital planner in determining the number of process machines required to meet that demand. Further, by comparing the count from operation to the next, those operations or machines with lower production yields may be identified for engineering attention.

Driven by a nearly exponential increase in demand for certain semiconductor and magnetic disk products, and the stringent clean room requirements necessary to manufacture these products, companies look to increased automation of their processes to overcome the contamination exposure when human operators and technicians are present in the process line. Automation is necessary to handle the sheer number of parts which must be counted, processed, and tested. However, automated parts handling requires that parts be sensed, i.e., that they are, in fact, present. Recognizing that parts sensing is essential for counting, for positioning for automated handling and parts transfer, and for identifying defective parts due to defective positioning in the carrier or boat, a fast, accurate, and reliable sensing system is essential to an automated parts handling system. However, the extremely thin, compoundly curved edges of semiconductor wafers and magnetic disks have, until now, represented a significant challenge in developing edge sensing devices capable of rapidly and accurately sensing these edges.

Sensing devices currently being used to count semiconductor wafers include a "through beam". Through-beams do not detect the edge of the wafer per se, rather, a light beam is passed through the cross-section of the parts carrier and moved longitudinally down the parts carrier. A count is made as the wafers or disks in the carrier interrupt the beam. However, this device is difficult to align and, generally, must be dedicated to a particular parts cassette. Further, the through beam is unable to detect "double-stacking"; i.e., where two wafers or disks have inadvertently been mounted in the parts carrier so that their adjacent faces are in contact. Double stacking invariably causes defects, such as scratches, on the precision surfaces of these products resulting in lower process yields and increased costs due to rejected parts. Ideally, early detection of double stacking is desirable to prevent further costly processing of these defective parts and to help identify which process step is the cause of the double-stacking. Through-beam parts detection will not be able to identify double stacked parts in those carriers where the parts are tilted or slightly askew in their slots. As semiconductor wafers and magnetic disks are very thin and the slot in the carrier is generally of a design that does not support the wafer or disk equally around its circumference the wafer or disk will sit slightly tilted in that slot. The tilted wafer or disk presents a wider profile to the through-beam than that of a perfectly aligned wafer or disk. This wider profile may be erroneously interpreted by the through-beam system as a double stacking occurrence.

Another process related error which may result in product defects is "cross-slotting." Cross-slotting occurs when a semiconductor wafer or magnetic disk is positioned in the parts carrier such that one edge of the wafer or disk in contact with the carrier is in the wrong retaining slot in the carrier. This results in the position of the wafer or disk in the carrier to be skewed or askant. Through beams are unable to detect such a condition. Detection of this process error requires comparing the position of the two side or laterally positioned edges of the wafer or disk to determine if the position of one edge along the longitudinal coordinate is different from the longitudinal coordinate of the other edge. Through-beam systems can detect a profile of the wafer or disk along the top to bottom axes of the parts carrier and for the reasons given above for double stacking, through-beams are unable to accurately detect parts which are in a skewed position. Consequently, through-beams would be unable to sense a side-to-side positional error such as that caused by cross-slotting. On the other hand, the accurate positioning capability of the dual beam sensor system of the present invention would merely require that both lateral edges of the wafers or disks in the carrier be scanned and the position of the edges of any parts be compared. Any relative differences in edge to edge spacing can be determined and the appropriate action taken.

Another parts detection scheme involves the use of a fiber optic light guide brought in close proximity to the position where the perimeter edge of the part is anticipated to be. This scheme is used extensively in the 10 inch and 14 inch magnetic disk manufacturing industry where large motorized disk carriers or "stackers" are used and the disks are mounted horizontally and stacked vertically. These stackers require precise alignment for docking into a receiving bay. The fiber optic sensor directs light towards the anticipated location of the perimeter edge of the top disk in the stacker. The fiber optic sensor detects the presence of the top disk in the stacker by receiving the reflected light back into the fiber optic cable with the reflected light being sensed by an optical sensor. However, this system requires that the terminal end of the fiber optic cable be in extreme close proximity to the edge of the top disk and that the incident light from the optic cable impinge at a 90° angle to the tangential surface of the edge of the disk. In addition, the edge of the disk must be thick enough so as to present as flat a surface as possible to the fiber optic light in order to provide enough surface to reflect back a sufficient amount of light to trigger the sensor. Thinner disks or disks having a compoundly curved edge will not reflect sufficient light directly back to the fiber cable and, therefore, the sensor will not detect the disk. In order to maintain such close proximity, the sensor is rigidly affixed to either the stacker or the receiving bay, thus precluding its use for rapid parts counting. This unreliability could result in process throughput deterioration because the fiber optic sensor erroneously senses there are no more parts to process causing the process to stop. Alternately, the stacker may continue indexing upward despite the top disk not having been sensed and removed causing a "double-disk" to occur as the unsensed disks falls back onto the next disk being indexed. In either case, such unreliability will require that an operator or technician be present to continually monitor production processes, thus negating the reasons for installing automated parts handling. This scheme is further limiting since the close proximity and the 90 degree angle of incidence required by the device precludes rapid scanning across the length of the carrier for a rapid parts count.

On the other hand, the spatial relationship of the sources and the detectors of the present invention permit sensing the presence of a reflective surface even where the angle of incident relative to the reflecting surface deviates greatly from 90 degrees thus enabling detection of compound curved reflective surfaces. Even greater deviations are possible for surfaces which have a diffusively reflective surface. Further, close proximity of the part being detected is not a requirement and there is significant latitude in the distance the part may be from the focal point of the converging beams and still be detectable. The light sources may be modulated to improve rejection of spurious signals caused by ambient light and to reduce the response time of the dual beam sensor.

While dual beam scanners are relatively common in the art, dual beam detection systems are conspicuously missing in the art. The background art reveals that scanner technology is generally directed to those situations where the surface to be scanned is presumed to be present and the purpose of the background art is to merely read information or indicia contained on that scanned surface. The present invention, however, makes no such presumption, its purpose being to detect, or determine, if a reflective surface is, in fact, present.

The Shepard et al series of patents (U.S. Pat. No. 4,409,470 et seq.) are directed to a portable laser scanning device for reading bar codes. The device includes a pulse modulated laser, a scanning means, and a detector. The scanned laser beam is directed to a reference plane outside of the device where the bar code is to be read. If a surface having a bar code is present, the laser light is reflected back towards the device wherein the signal is processed to generate data describing the bar code symbol. Shepard does not teach using dual converging beams. Further, the purpose of the Shepard invention is to read indicia from a target surface whose presence is presumed.

The Buczek reference (U.S. Statutory Invention Registration No. H933) is directed towards a laser range finder. The device is a dual beam, amplitude modulated laser transmitter/receiver and includes dual lasers, each modulated to a different frequency. Upon superimposing the two beams, the intensity of each beam is modulated at the laser difference frequency. When the laser frequency of one of the sources changes, a signal is generated which may be used for absolute range measurements. Buczek does not use converging laser beams. Further, the purpose of amplitude modulation is for generating fine doppler shifts rather than for rejection of spurious ambient signals. Buczek reveals information regarding a target presumptively in the path of the laser beams, i.e., the distance to a target already known to be present. As in Shepard the presence of the target is presumed.

The Kramer et al patents (U.S. Pat. Nos. 4,786,126 and 4,826,268) are principally directed towards a twin laser scanning device suitable for use in high speed laser printers for reprographic image production. The device includes pulse modulated, twin collinear laser beams. The beams are scanned across an image surface using a rotating diffraction grating based deflector element. Here, modulation of the laser beams is related to the formation of high density half-tone images and not for spurious signal rejection. The device does not include optical detectors, nor do the laser beams converge to a single point. Kramer also describes using a light emitting diode and detector as an image surface motion detector to measure indicia located on the specular surface of a rotating drum. The indicia causes interruptions in the reflective surface and are used to create a control signal. As in Shepard and Buczek, Kramer presumes that there is a surface present to be scanned.

Shambaugh (U.S. Pat. No. 5,231,463) is directed to using laser Doppler velocimetry to measure the filament velocity in the fiber stream of a melt blowing apparatus. A single laser beam is split into two separate beams, with one beam passing through a Bragg cell causing a frequency shift in that beam. Both beams are optically transferred to a backscatter probe from which they exit. The beams converge at a single point within the fiber stream. The convergence of the two beams form a measuring volume such that when a fiber crosses the measuring volume, optical impulses are created and subsequently detected by a detector in the backscatter probe. The impulses are further processed to provide information as to fiber velocity and other data. Although Shambaugh uses a single laser to generate dual converging laser beams, these beams are frequency shifted using a Bragg cell and narrowly separated. Shambaugh's dual beams are used for laser doppler velocimetry which, again, presumes the presence of a surface (here the surface of a falling fiber), and the attribute being measured here is mass flow.

SUMMARY OF THE INVENTION

Accordingly, it is the general object of the present invention to provide an edge detection system for overcoming the aforementioned drawbacks of the prior art semiconductor wafer and magnetic disk edge proximity sensing systems.

Another object of the invention is to provide a dual beam optical scanning system for the edge detection of semiconductor wafers and magnetic disks.

Still another object of the invention is to provide a semiconductor wafer and magnetic disk edge detection system capable of edge detection where the surface is highly specular or reflective and where the edge presents an angle of incidence deviating significantly from being perpendicular to the centerline of the light beams of the sensing device.

An additional object of the invention is to provide a semiconductor wafer and magnetic disk edge detection system capable of edge detection where detection of multiple edges may be performed rapidly and accurately.

A further object of the invention is to provide a semiconductor wafer and magnetic disk edge detection system capable of edge detection which may be interfaced to an automated process handling device.

Still another object of the invention is to provide a semiconductor wafer and magnetic disk edge detection system capable of edge detection which will reject spurious signals from ambient light.

An additional object of the invention is to provide a semiconductor wafer and magnetic disk edge detection system capable of edge detection where the edge is significantly outside of the focal plane of the dual optical beams.

A further object of this invention is to provide a detection system capable of detecting compoundly curved specular or reflective surfaces.

The foregoing and other objects, features, aspects and advantages of the present invention will become more apparent from the following summary and detailed description of the present invention, when taken in conjunction with the accompanying drawings.

The present invention is directed to a semiconductor wafer and magnetic disk edge detection system having a converging dual-beam optical sensor for detecting the presence of small, specular surfaces, particularly small radius curved surfaces. The sensor comprises at least 2 light sources, preferably lasers, and at least 2 light detectors. Alternately, a single light source with its light beam passed through the appropriate optics may have its beam split to create at least two light beams. Further, a single light detector may be used together with the appropriate optics such that the reflected light is directed by the optics to the light detector. The light sources, or alternately light beams emanating from a light source, are spatially oriented such that the focal point of the converging light beams define a focal or inspection plane and converge at a single point external to the device. When the specular or reflective surface to be detected interrupts the beam at or near the focal point of the light sources, it causes the light to be reflected backwards towards the sensor for direct detection by the light detectors or for indirect detection where the appropriate optics direct the reflected light to at least one light detector. The light detectors, or the optical path for indirect detection, are spatially arranged to permit detection of the reflected light even though the surface to be detected is curved or presents a reflecting angle, or angle of incidence, deviating significantly from 90°.

Another feature of the detection system is a means for moving either the sensor or the parts to be detected in order to scan the parts to be counted or identified. This would include affixing the sensor to a linear motor, attaching it to a robotic arm, manually scanning by hand, or by passing the parts to be sensed past a fixed, stationary sensor. The sensor may then be moved across the parts to be detected.

Yet another feature of the present invention is an electronic interface which reads the information sent by the sensor and uses it for making process queuing decisions, inventory control, defect detection, and the like.

An advantage of this system is that it is much more effective and efficient than existing systems in detecting the presence of small reflective or specular surfaces, particularly where the surface is curved or is a skewed edge surface and rapid detection is required, as is the case for detecting the edge of a thin semiconductor wafer or other disk-shaped object. Alignment is not critical in that the sensor is able to detect reflected light over a wide angle of incidence and where the surface to be detected is not immediately in the inspection plane defined by the converging beams.

These and other objects and advantages of the present invention will no doubt become apparent to those skilled in the art after having read the following detailed description of the preferred embodiment which is illustrated in the several figures of the drawing.

IN THE DRAWING

FIG. 1 is a diagram of a semiconductor wafer or magnetic disk edge detection system where the sensor head is mounted on a linear motor for automatically detecting the parts in a carrier directly beneath it.

FIG. 2 is an alternate semiconductor wafer or magnetic disk edge detection system wherein the sensor head is mounted onto a robotic arm and the robotic arm is articulated so that a parts in the carrier are detected.

FIG. 3 is diagram of the sensor head used in the semiconductor wafer or magnetic disk edge detection system of this invention.

FIG. 4A is a diagram showing the sensor head misaligned with respect to the part being detected.

FIG. 4B is a diagram showing how the centerline of the dual beams may deviate from the radial axis of a perfectly reflective edge surface and still be detectable.

FIG. 5 is a diagram of a single light source with its light beam split to provide two separate light beams on two separate optical axes.

FIG. 6 is a diagram of a single detector in combination with the appropriate optics to permit indirect detection by directing reflected light to a light detector.

DETAILED DESCRIPTION OF THE PREFERRED EMBODIMENT

The following detailed description illustrates the invention in terms of several embodiments, adaptations, variations, alternatives and uses of the invention, including what we presently believe is the best mode of carrying out the invention.

FIG. 1 shows a semiconductor wafer or small magnetic disk edge detection system. The sensor unit 10 is mounted on a linear motor 12 allowing the sensor unit to move the length of the motor bar 14. The semiconductor wafers or magnetic disks 16 are mounted in a carrier 18. Transport means 15 places the carrier under the linear motor such that when the sensor unit moves from one end of the motor bar to the other end, all of the parts in the carrier are detected by the sensor unit. The transport means 15 may be a conveyor belt as shown, a transfer table, a robotic pick-up arm or transfer means, or simply manually placing the parts carrier in place to be scanned for parts detection.

There are many position encoding devices and methods which may be used to determine the position of the sensor head and, hence, the position of the part detected. However, the preferred embodiment includes an optical encoder, which are well known in the art, attached to the motors of a robotic arm, or the motor of any transfer means so that the position of the part detected be readily determined. An alternate preferred encoding method includes a stationary or fixed positioning reference 9 allows the detection system to provide accurate position information of each wafer or disk detected. This positional reference may be periodically scanned by the sensor unit and the position coordinates of the reference noted in the operating program of the detection system. The position of process parts subsequently detected may be ascertained relative to this stationary standard.

Upon detecting the edge of a wafer or disk, information including position, planar orientation of the part, relative position to other parts may be sent to an information processing unit 17. Another linear motor 13 on the same motor bar may be used for parts transfer. A parts pick-up tool 11 may be attached to the linear motor. Once the parts have been counted and their positions within the carrier determined by the detection system, the pick-up tool uses the position information to access and remove parts from the carrier 18 and to transfer the parts to either another carrier 19, as shown, or to a process machine for further processing.

FIG. 2 shows an alternate semiconductor wafer or magnetic disk edge detection system. In this embodiment, the sensor unit 10 is mounted to the tool end 22 of a robotic arm 24. The semiconductor wafers or magnetic disks 16 are mounted in a carrier 18. Transport means 15 places the carrier under the robotic arm such that the edges of the wafers or disks may be detected when the sensor unit is passed from one end of the carrier to the other by the robotic arm. A stationary or fixed positioning reference 9 allows the detection system to provide accurate position information of each wafer or disk detected. This positional reference is scanned by the sensor unit periodically to ensure calibration of the sensor system. The transport means 15 may be a conveyor belt as shown, a transfer table, a robotic arm pick-up or transfer means, or simply manually placing the carrier in place to be scanned. Pick-up tool 26 may be incorporated in the robotic arm. Once the wafer or disk position has been ascertained by the sensor unit, the information is sent to an information processing unit 17. This information is used by the pick-up tool which may then be rotated and positioned to access the part. This will permit parts transfer for further processing or the removal of defective parts.

FIG. 3 is a schematic view of the sensor unit. Two light sources 1, preferably solid state lasers, and at least two light detectors 2 are mounted on a printed circuit board 3 within the sensor housing 4. The light from light sources 1 are focused and are spatially oriented such that the focused beams 6 from the light sources define a plane and converge to a single focal point 7 external to the device. The acute angle defined by the centerline of the converging light beams in the preferred embodiment is approximately 21.5°, but may be wider should greater tolerance of radial misalignment error be desired. In the preferred embodiment the light detectors 2 are arranged on the outside of the light sources 1 forming an acute angle of 14.5° between it and the adjacent light source. Note that the positions of the light sources and the light detectors may be juxtaposed without affecting the performance of the sensor unit.

The printed circuit board 3 pulse modulates the power to the light sources thus allowing the unit to reject spurious signals from ambient light sources. The modulation frequency is set at 10,000 Hz improving the response time and noise rejection thus allowing the unit to scan parts rapidly. Digital signal processing (DSP) is used to ensure accurate signal detection and processing, thus allowing for faster response time of the sensor unit.

FIG. 4A depicts a condition where the light 6 impinges perpendicularly to the tangent of the arc of the edge of the disk being illuminated, i.e., the edge portion of the wafer or disk illuminated 42 is on a line collinear with the radius line connecting the center of the wafer or disk and the center line of the sensor unit. In this instance the light is reflected directly back to the sensor unit. Also shown is where the light illuminates an edge portion of the disk 43 not on a line collinear with the with the radius line connecting the center of the wafer or disk and the center line of the light beams of the sensor unit. In this instance, the light is not reflected straight backwards, but rather is reflected to one side or the other.

FIG. 4B shows how the spatial orientation of the light sources 1 and the detectors 2 allow detection of the wafer edge despite the edge surface significantly deviating from being perpendicular to the illuminating light beams. In practice, the maximum angle by which a reflective surface, as from a highly reflective semiconductor surface, may deviate from being perpendicular to the illuminating light beams and still be detectable has been measured to be greater than 30°.

FIG. 5 depicts an alternate embodiment of the light source of the sensor unit. The light beam 62 from a light source 1 is directed to a beam splitter 64 to create two separate light beams 61 and 63. The light beam reflected from the beam splitter 63 is directed to a mirror 67 and a converging lens 68. The light beam passing through the beam splitter 61 is directed along its own separate optical axis to another mirror 67 and converging lens 68. The two light beams are directed to and converge at an inspection point 69. The mirror and converging lens are spatially oriented relative to the other mirror and converging lens so as to create the desired angle between the converging light beams. This scheme is exemplary of how a single light beam from a single light source might be divided to provide multiple light beams for use in the detection system of the present invention.

FIG. 6 depicts an alternate light detector system wherein a single light detector 2 is used to detect reflected light over a wide angle. Reflected light 72 strikes a mirror 77 and is further directed to a combining prism 74. Light from multiple mirrors on different optical axes may be directed to the combining prism. The combined light beams are then directed to a light detector 2. This diagram is exemplary of an optical detection scheme employing a reduced number of light detectors.

It should be understood that various modifications within the scope of this invention can be made by one of ordinary skill in the art without departing from the spirit thereof. For example, the sensor unit may be adapted to permit manual detection of semiconductor and magnetic disk edges. A finger trigger may be supplied in order to turn the sensor on and off, and a pistol grip may be made part of the housing of the sensor unit to facilitate manual operation of the sensor unit. Additionally, a spacing/alignment jig may be attached or integrated into the housing of the sensor unit to ensure that the inspection plane defined by the light sources is parallel to the plane of the disk shaped parts to be detected.

An alternative example would include rigidly fixed sensor head with the parts to be detected moving passed the sensor. This parts indexing method is useful for edge detection of disks or wafers which are mechanically indexed for pick-up by a transfer arm for placement into a process machine. The fixed sensor determines whether a wafer or disk is present or in place so that it might be picked up. Alternately, the fixed sensor system may be used for detecting reflective or specular surfaces such as bottles or cans which may have compoundly curved surfaces not otherwise easily detectable. It is intended that the invention be defined by the scope of the appended claims as broadly as the prior art will permit.

What is claimed is:

1. An edge detection system for detecting the presence and position of disk-shaped objects intended to lie within parallel planes, comprising:

a first light source and associated optical elements defining a first optical axis and focusing a first light beam from said first light source to a predetermined point along said first optical axis;

a second light source and associated optical elements defining a second optical axis intersecting said first optical axis at said predetermined point and focusing a second light beam from said second source at said predetermined point, said first and second optical axes defining an inspection plane parallel to said parallel planes;

means for causing relative movement between said disks and said first and second light sources in a direction normal to said inspection plane;

light detector means for detecting light reflected from an edge of one of said disk-shaped objects as the disk and said first and second light sources are moved relative to each other such that the edge moves through said inspection plane and is intersected by at least one of said first and second light beams, and for generating a signal corresponding thereto said signal resulting from the digital processing of the detected reflected light; and a position encoding means for providing position information of the detected objects to the edge detection system.

2. An edge detection system for detecting the presence and position of disk-shaped objects intended to lie within parallel planes as recited in claim 1 wherein said light detecting means includes a first light sensor disposed proximate to said first light source for receiving light from either said first light source or said second light source reflected from an edge of said disk-shaped object, and a second light sensor disposed proximate to said second light source for receiving light from either said second light source or said first light source reflected from an edge of said disk-shaped object.

3. An edge detection system for detecting the presence and position of disk-shaped objects intended to lie within parallel planes as in claim 1 wherein said movement means is selected from the group consisting of a robotic arm, a linear motor, a conveyor belt, a disk indexing system, by hand and combinations thereof.

4. An edge detection system for detecting the presence and position of disk-shaped objects intended to lie within parallel planes as in claim 1 wherein said signal is processed by a data processing means, in cooperation with said position encoding means, for providing proximity and positional information.

5. An edge detection system for detecting the presence and position of disk-shaped objects intended to lie within parallel planes as in claim 4 wherein said positional encoding means is an optical encoder.

6. An edge detection system for detecting the presence and position of disk-shaped objects intended to lie within parallel planes as in claim 2 wherein said first light source and said second light source are modulated to reject ambient light and to provide improved parts detection sensitivity as compared to a non-modulated light source.

7. An edge detection system for detecting the presence and position of disk-shaped objects intended to lie within parallel planes as in claim 6 wherein said first light source and said second light source are lasers.

8. A method for detecting the presence and position of the edge of disk-shaped objects intended to lie within parallel planes, comprising the steps of:

providing a sensor unit having at least one light source and associated optics to provide at least two optical axes spatially oriented so that the beams focus and converge at a single point external to the sensor unit and define an inspection plane, and at least one light detector spatially oriented to allow detection of light reflected from an edge of a disk-shaped object;

positioning a carrier containing said disk-shaped objects so that an edge of a disk-shaped object may be detected by said sensor unit if the edge of said disk-shaped object lies within said inspection plane;

moving said sensor unit or said carrier relative to the other so that the edges of said disk-shaped objects are passed through said inspection plane of said sensor unit;

detecting light reflected from the edge of said disk-shaped object as it is passed through the inspection plane of said sensor unit; and generating a signal for determining proximity and position of said wafer or disk.

9. An optical detection system for detecting the presence of compoundly curved specular surfaces, comprising:

a first light source and associated optical elements defining a first optical axis and focusing a first light beam from said first light source to a predetermined point along said first optical axis;

a second light source and associated optical elements defining a second optical axis intersecting said first optical axis at said predetermined point and focusing a second light beam from said second source at said predetermined point, said first and second optical axes defining an inspection plane parallel to said parallel planes;

means for causing relative movement between the specular surface and said first and second light sources in a direction normal to said inspection plane; and light detector means for detecting light reflected from the specular surface as the specular surface and said first and second light sources are moved relative to each other such that the specular surface moves through said inspection plane and is intersected by at least one of said first and second light beams, and for generating a signal corresponding thereto.

10. An optical detection system for detecting the presence of compoundly curved specular surfaces as in claim 9 wherein said light detecting means includes a first light sensor disposed proximate to said first light source for receiving light from either said first light source or said second light source reflected from a specular surface, and a second light sensor disposed proximate to said second light source for receiving light from either said second light source or said first light source reflected from a specular surface.

11. An optical detection system for detecting the presence of compoundly curved specular surfaces as in claim 10 wherein said movement means is selected from the group consisting of a robotic arm, a linear motor, a conveyor belt, a mechanical gravity fed conveyor system, a disk indexing system, by hand and combinations thereof.

12. An optical detection system for detecting the presence of compoundly curved specular surfaces as in claim 11 wherein said signal is processed by a data processing means for providing inventory and throughput information.

* * * * *